(12) United States Patent
Hamasaki

(10) Patent No.: US 6,274,401 B1
(45) Date of Patent: Aug. 14, 2001

(54) METHOD OF MANUFACTURING A CCD SENSOR WITH A DEEP WELL

(75) Inventor: Masaharu Hamasaki, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 08/289,347

(22) Filed: Aug. 11, 1994

Related U.S. Application Data

(63) Continuation of application No. 08/016,267, filed on Feb. 11, 1993.

(30) Foreign Application Priority Data

Feb. 15, 1997 (JP) .................................................. 4-061262

(51) Int. Cl.[7] .................................................. H01L 21/339
(52) U.S. Cl. .................................................. 438/79; 438/530
(58) Field of Search .................................. 437/34, 53, 70, 437/74, 75, 149, 150, 152, 930, 931; 148/DIG. 76, DIG. 82, DIG. 83; 438/60, 75, 78, 79, 144, 224, 228, 530

(56) References Cited

U.S. PATENT DOCUMENTS

| | | | |
|---|---|---|---|
| 4,729,964 | * 3/1988 | Natsuaki | 437/150 |
| 5,134,301 | * 7/1992 | Kamata et al. | 250/492.2 |
| 5,141,882 | * 8/1992 | Komori et al. | 437/34 |
| 5,160,996 | * 11/1992 | Odanaka | 257/375 |
| 5,238,860 | * 8/1993 | Sawada et al. | 437/152 |

OTHER PUBLICATIONS

Pramanik et al., "MeV Implantation for Silicon Device Fabrication", Solid State Technology, May 1984, pp. 211–216.*

* cited by examiner

*Primary Examiner*—Chandra Chaudhari
(74) *Attorney, Agent, or Firm*—Sonnenschein, Nath & Rosenthal

(57) ABSTRACT

The present invention is directed to a method of manufacturing a semiconductor device in which ion implantation of impurities is carried out at energy of 0.7 to 16 MeV and the impurities are diffused by heat treatment during a period in which a diffusion time calculated in terms of 1100° C. is within 10 hours to thereby form wells. Therefore, a heat treatment time for forming wells of semiconductor devices such as CCD, CMOSIC or the like can be reduced.

1 Claim, 4 Drawing Sheets

CCD

CMOS

CMOS

F I G. 4
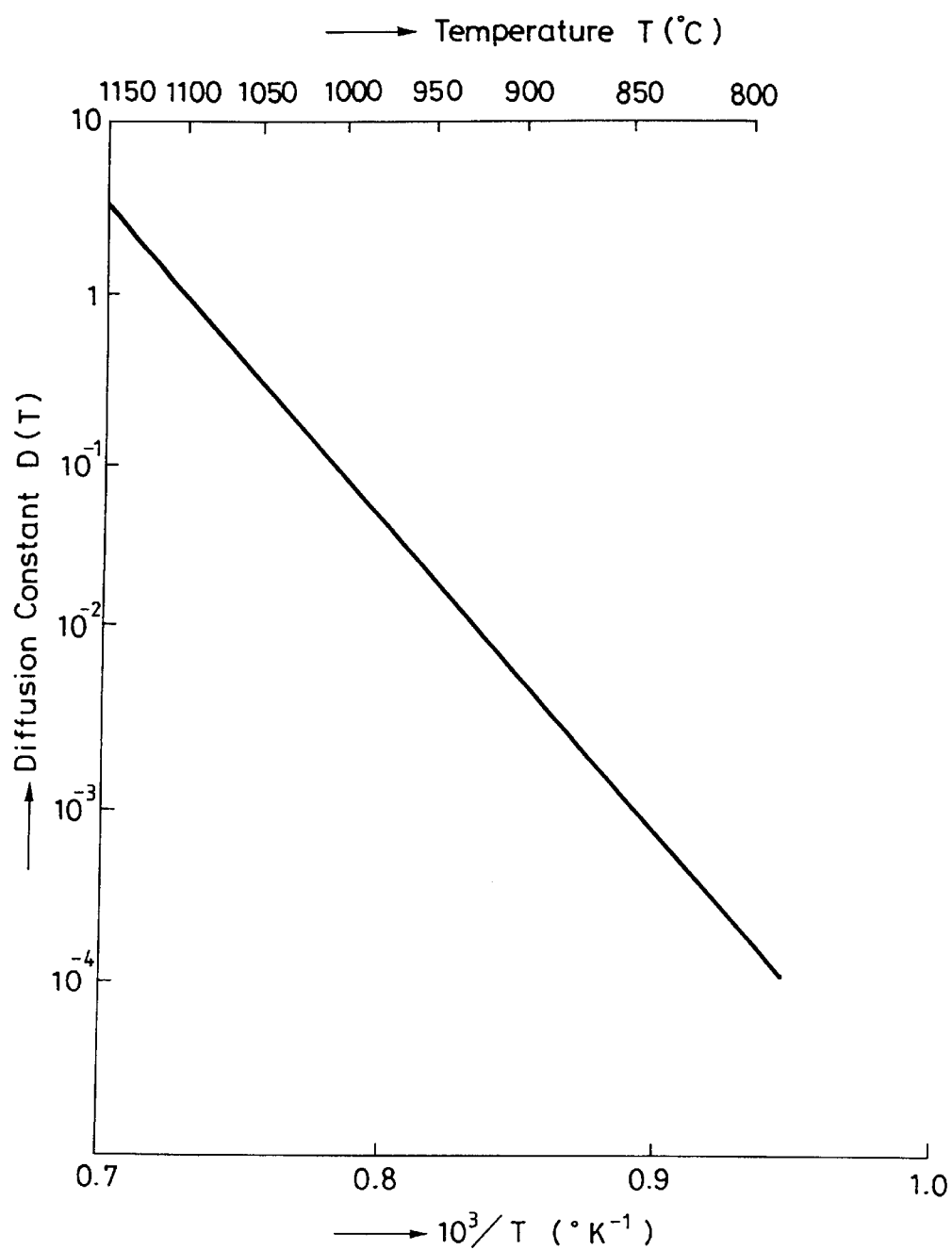

METHOD OF MANUFACTURING A CCD SENSOR WITH A DEEP WELL

This is a continuation of application Ser. No. 08/016,267, filed Feb. 11, 1993.

BACKGROUND OF THE INVENTION

1. Field of the Invention

The present invention relates generally to a method of manufacturing a semiconductor device and, more particularly, to a semiconductor device manufacturing method for forming wells which are indispensable to a CCD (charge coupled device), a CMOSIC (complementary metal oxide semiconductor integrated circuit) or the like.

2. Description of the Prior Art

FIGS. 1A through 1C are cross-sectional views showing examples of respective semiconductor devices having wells. FIG. 1A shows an example of a CCD image sensor and FIGS. 1B, 1C show examples of CMOSICs, respectively. FIG. 1C shows the example of CMOSIC in which an isolating n-type well is formed in order to isolate a p-type well and an n-type well when a negative bias voltage is applied to a p-type semiconductor substrate. Throughout FIGS. 1A to 1C, reference symbols a and b depict p-type wells and reference symbol c depicts an n-type well. Generally, it is known that the wells a, b and c are formed by selectively diffusing impurities on a surface portion of the semiconductor substrate.

Since the wells are formed by the diffusion of impurities in the prior art, it takes an extremely long time to form wells. That is, a diffusion time of several 10s of hours calculated in terms of 1100° C. is required. If such long diffusion time is required as described above, then productivity of semiconductor device is naturally lowered, which becomes a factor for hindering semiconductor devices from being produced inexpensively. Also, impurities are diffused in the lateral direction and hence devices cannot be miniaturized like micro-devices. Further, there is the risk that the core tube, wafer holding boat or the like will be deformed by heat. Furthermore, there is the risk such that a metal in a high temperature heater will be diffused into the core tube to contaminate the surface portion of the semiconductor wafer.

OBJECTS AND SUMMARY OF THE INVENTION

Therefore, it is an object of the present invention to provide a method of manufacturing a semiconductor device in which the aforesaid shortcomings and disadvantages of the prior art can be eliminated.

It is an object of the present invention to provide a method of manufacturing a semiconductor device in which a heat treatment time for forming wells can be reduced.

It is another object of the present invention to provide a method of manufacturing a semiconductor device in which productivity of semiconductor device can be improved.

It is still another object of the present invention to provide a method of manufacturing a semiconductor device in which semiconductor devices can be produced inexpensively.

According to an aspect of the present invention, there is provided a method of manufacturing a semiconductor device in which ion implantation of impurities is carried out at energy of 0.7 to 16 MeV and the impurities are treated by heat treatment during a period in which a diffusion time calculated in terms of 1100° C. is within 10 hours to thereby form wells.

According to the method of manufacturing a semiconductor device of the present invention, since impurities are implanted at very large energy of 0.7 to 16 MeV and then diffused, even deep wells can be formed during a heat treatment time within 10 hours which is considerably shorter than that of the prior art.

The above and other objects, features, and advantages of the present invention will become apparent from the following detailed description of an illustrative embodiment thereof to be read in conjunction with the accompanying drawings, in which like reference numerals are used to identify the same or similar parts in the several views.

BRIEF DESCRIPTION OF THE DRAWINGS

FIG. 4 is a graph showing a temperature dependency of impurity diffusion constant.

DETAILED DESCRIPTION OF THE PREFERRED EMBODIMENT

A method of manufacturing a semiconductor device according to the present invention will hereinafter be described in detail with reference to the drawings.

Figure 1A:
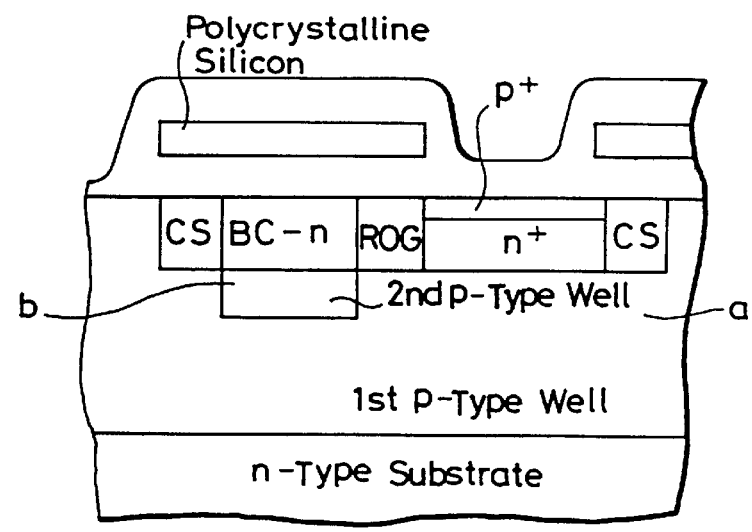
FIGS. 1A through 1C are respectively cross-sectional views showing examples of respective semiconductor devices to which the present invention is applied.
Figure 1B:
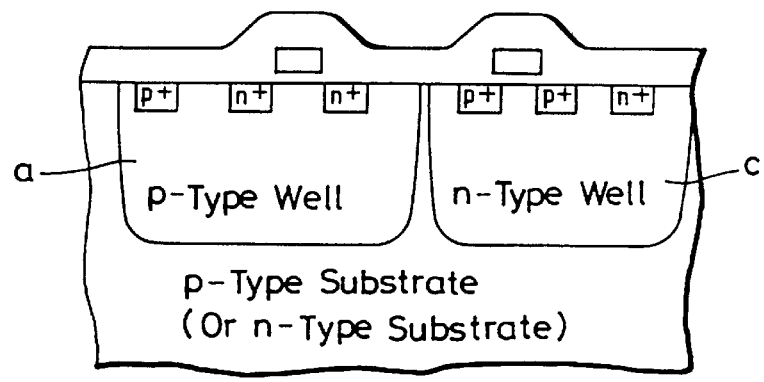
Figure 1C:
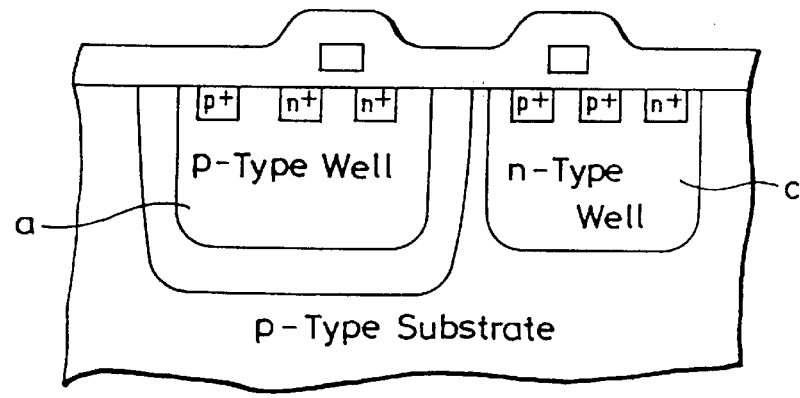
Figure 2A:
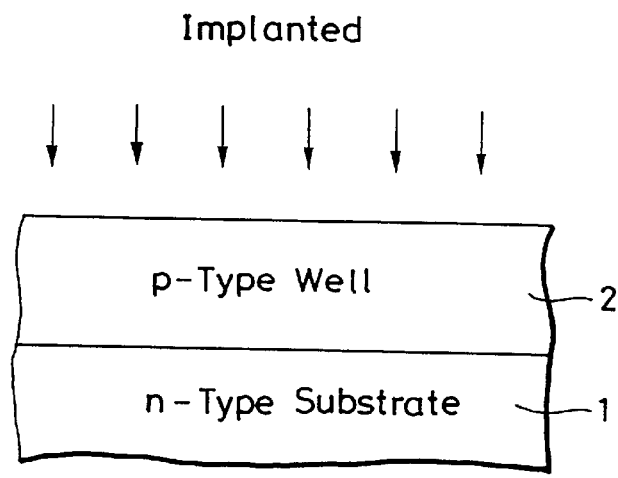
FIGS. 2A and 2B are respectively cross-sectional views showing a method of manufacturing a semiconductor device according to an embodiment of the present invention in the sequential order of manufacturing process.
Figure 2B:
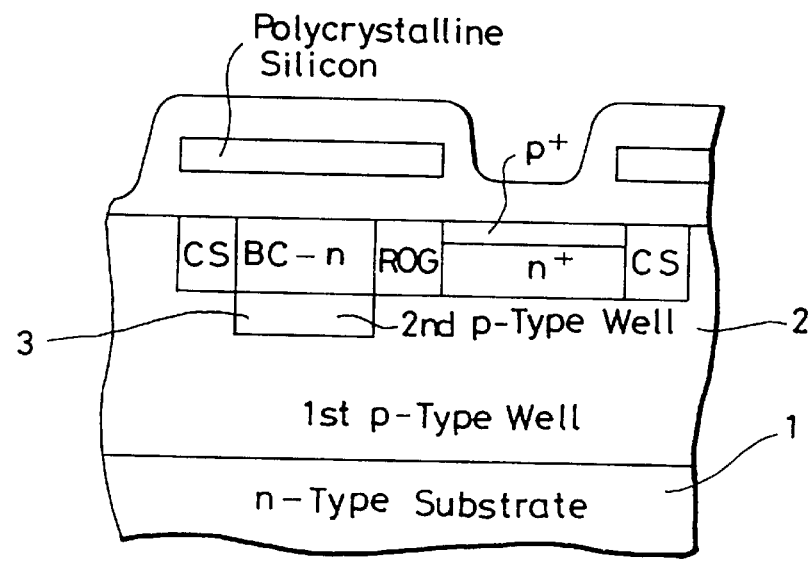

FIGS. 2A and 2B are respectively cross-sectional views showing a method of manufacturing a semiconductor device according to an embodiment of the present invention in the sequential order of manufacturing process.

Initially, as shown in FIG. 2A, a first p-type well 2 is formed on an n-type semiconductor substrate 1 by ion implantation of p-type impurities on the surface portion of the n-type semiconductor substrate 1. This ion implantation is carried out at very large energy of 0.7 to 16 MeV. As shown in FIG. 2A, the upper surface of the semiconductor substrate is free of any layers. The diffusion process for diffusing the impurities is not required by the manufacturing method of semiconductor device according to the present invention but instead, the diffusion of impurities for forming the wells is carried out by the heat treatment such as oxidation of gate, oxidation of polycrystalline silicon, anneal treatment after ion implantation or the like.

After the ion implantation of impurities for forming the well, a semiconductor device is manufactured by a method substantially similar to the conventional method to thereby make a CCD shown in FIG. 2B. In FIG. 2B, reference numeral 3 depicts a second p-type well.

Figure 3:
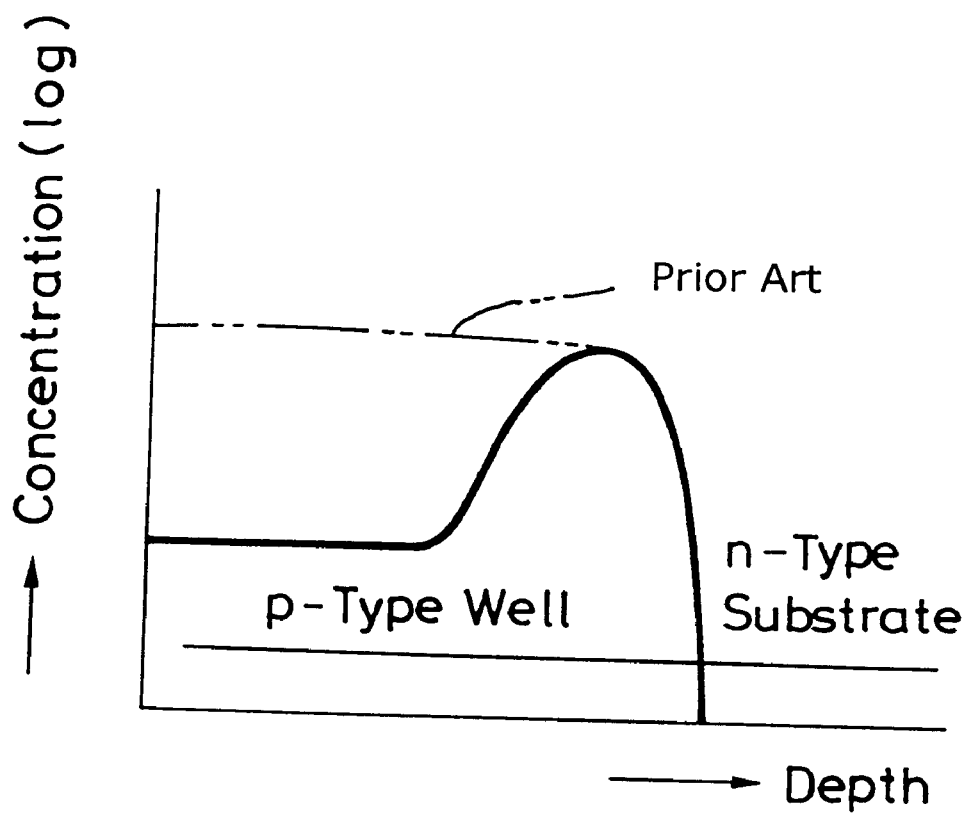
FIG. 3 is a graph showing an impurity concentration distribution in the depth direction of a substrate.

Then, the whole heat treatment time is selected to be less than 10 hours calculated in terms of 1100° C. FIG. 3 is a graph showing an impurity concentration distribution in the depth direction of the substrate. A two-dot chain line curve represents an impurity concentration distribution of the prior art.

The whole heat treatment time depends on a diffusion constant D of impurity for ion implantation. The diffusion constant D is expressed by the following equation (1).

$$D = D_0 \cdot \exp\left(-\frac{E_A}{k \cdot T}\right)$$

where $D_0$ is the diffusion coefficient when a temperature is infinite and $E_A$ is the activation energy, which is about 3.5 to 4.0 eV.

The diffusion length is expressed by a root (D·T) of the product of the diffusion coefficient D and the heat treatment time t.

FIG. 4 shows a temperature dependency of diffusion coefficient D of the above equation (1) under the condition that the activation energy $E_A$ is selected to be a mean value, i.e., 3.7 eV and that diffusion coefficient D calculated in terms of 1100° C. is selected to be 1.

Assuming that the whole heat treatment time at temperature of 1100° C. is $t_{1100}$, the whole heat treatment time at temperature of 1000° C. is $t_{1000}$ and that the whole heat treatment time at temperature of 900° C. is $t_{900}$, then a total ta of heat treatment times calculated in terms of 1100° C. is expressed by the following equation (2):

$$ta = t_{1000} + 0.088 t_{1100} + 5.1 \times 10^{-3} t_{900}. \quad (2)$$

In this case, the conversion is carried out on the basis of the following table 1.

TABLE 1

| Temperature ° C. | Conversion factor |
|---|---|
| 1150 | 3.0 |
| 1100 | 1.0 |
| 1050 | 0.31 |
| 1000 | 0.088 |
| 950 | $2.3 \times 10^{-2}$ |
| 900 | $5.1 \times 10^{-3}$ |
| 850 | $1.0 \times 10^{-3}$ |
| 800 | $1.8 \times 10^{-4}$ |

The equation in which an actual heat treatment time is calculated in terms of 1100° C. is expressed by the following equation (3):

$$t_a = t \frac{\exp\left(\frac{-3.7\,\text{eV}}{k \cdot T}\right)}{\exp\left(\frac{-3.7\,\text{eV}}{k \cdot 1373°\,\text{K}}\right)}$$

where ta is the time calculated in terms of 1100° C.

Then, a total heat treatment time ta calculated in terms of 1100° C. was selected to be less than 10 hours and the CCD could be manufactured.

As described above, in the method of manufacturing a semiconductor according to the present invention, the ion implantation of impurities is carried out at very large energy of 0.7 to 16 MeV. Therefore, even when a well is too deep, the well 2 can be formed is less than 10 hours calculated in terms of 1100° C. which heat treatment time is very shorter than the conventional heat treatment time required.

Therefore according to the method of manufacturing a semiconductor device of the present invention, when the ion implantation of impurities for forming wells is carried out, any special diffusion process for forming the well is not required and the well can be formed in the heat treatment process such as oxidation, anneal treatment, high temperature CVD (chemical vapor deposition) process or the like. Thus, the productivity of CCD can be improved and semiconductor devices can be made inexpensive.

Further, since the heat treatment time is short, the diffusion of impurity in the lateral direction can be reduced, which can contribute to semiconductor devices when the semiconductor devices are formed as micro-devices and devices of high integration level.

Since the heat treatment time is short as described above, there is then no risk that a core tube or wafer holding boat will be deformed by heat. Further, there is no risk that a metal from a high temperature heater enters the core tube to contaminate the wafer surface.

Furthermore, it is possible to realize an impurity concentration profile in the depth direction of the substrate as shown in FIG. 3. That is, a peak of the impurity concentration is located at a very deep position from the substrate surface so that a relatively low impurity concentration region can be formed on the surface.

When the well is formed only by the diffusion process according to the prior art, as shown by a two-dot chain line curve in FIG. 3, a concentration on the surface cannot be lowered as compared with the peak concentration of the well. As a result, the improvement of characteristics such as reduction of residual image, blooming or the like was substantially impossible. According to the method of manufacturing a semiconductor device of the present invention, as shown by a solid curve in FIG. 3, the concentration on the surface can be lowered more than the peak concentration of the well, which can effect the improvement of characteristics such as reduction of residual image, blooming or the like.

The method of manufacturing a semiconductor device was applied to the process so that the first n-type well 1 of the interline transfer type CCD is formed. However, the method of manufacturing a semiconductor device of the present invention is not limited thereto and may be applied to the process where the second p-type well 3 is formed on the lower portion of a vertical register ($n^+$). Further, the present invention may be applied to the process where wells of a variety of CMOSICs (e.g., CMOSICs shown in FIGS. 2A, 2B) are formed.

In the method of manufacturing a semiconductor device according to the present invention, the ion implantation of impurities is carried out at energy of 0.7 to 16 MeV and thereafter, the impurities are treated by the heat treatment process during the diffusion time of 10 hours calculated in terms of 1100° C.

Therefore, according to the method of manufacturing a semiconductor device of the present invention, the ion implantation of impurities is carried out at very large energy of 0.7 to 16 MeV and then the impurities are diffused. Thus, even a deep well can be formed by the diffusion process within 10 hours which diffusion time is very shorter than the conventional diffusion time. Hence, the productivity of semiconductor device can be increased and the manufacturing cost of semiconductor device can be reduced.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A method of manufacturing an interline CCD image sensor, the method comprising the steps of:

providing a semiconductor substrate of a first conductivity type;

ion-implanting impurities directly into the semiconductor substrate which is free of any layer at an energy of 0.7 to 16 MeV;

heat-treating the implanted impurities for a period in which a diffusion time calculated in terms of 1100° C. is less than 10 hours so as to form a well of a second conductivity type in the semiconductor substrate; and forming an image sensing section and a vertical transfer channel in a surface of the well wherein the well is formed such that a peak of an impurity concentration is located at a deep position from the substrate surface so that a relatively lower impurity concentration region is formed on the surface thereby to reduce residual image and blooming of the image sensor.

* * * * *